(12) United States Patent
Nettesheim et al.

(10) Patent No.: US 9,576,775 B2
(45) Date of Patent: Feb. 21, 2017

(54) PLASMA GENERATING DEVICE

(71) Applicants: relyon plasma GmbH, Regensburg (DE); EPCOS AG, Munich (DE)

(72) Inventors: Stefan Nettesheim, Berlin (DE); Georg Kuegerl, Eibiswald (AT); Markus Puff, Graz (AT)

(73) Assignees: EPCOS AG, Munich (DE); reylon plasma GmbH, Regensburg (DE)

( * ) Notice: Subject to any disclaimer, the term of this patent is extended or adjusted under 35 U.S.C. 154(b) by 0 days.

(21) Appl. No.: 14/532,894

(22) Filed: Nov. 4, 2014

(65) Prior Publication Data

US 2015/0054405 A1 Feb. 26, 2015

Related U.S. Application Data

(63) Continuation of application No. PCT/EP2013/059150, filed on May 2, 2013.

(30) Foreign Application Priority Data

May 4, 2012 (DE) .......................... 10 2012 103 938

(51) Int. Cl.
  *B01J 19/08* (2006.01)
  *H01J 37/32* (2006.01)
  (Continued)

(52) U.S. Cl.
  CPC .... *H01J 37/32449* (2013.01); *H01J 37/32899* (2013.01); *H05H 1/36* (2013.01); *H05H 1/44* (2013.01)

(58) Field of Classification Search
  CPC ........ H01J 37/16; H01J 37/32009; H01J 1/26; H01J 37/32155; H01J 37/32091; H01J 37/32183; A61L 2/14
  (Continued)

(56) References Cited

U.S. PATENT DOCUMENTS 3,660,630 A    5/1972   Sunnen et al.
5,090,340 A    2/1992   Burgess
(Continued)

FOREIGN PATENT DOCUMENTS

DE    2014592 A    10/1970
DE    3733492 A1    4/1989
(Continued)

OTHER PUBLICATIONS

Title: DE102007010996, Author:Willimzik Martin, Date:Sep. 11, 2008.*
(Continued)

*Primary Examiner* — Douglas W Owens
*Assistant Examiner* — Wei Chan
(74) *Attorney, Agent, or Firm* — Simpson & Simpson, PLLC (57) ABSTRACT

The invention relates to a plasma generation device comprising a plurality of plasma modules for generating a plasma. Each plasma module has a module housing with at least one gas inlet for supplying a process gas. Furthermore, a discharge device for generating the plasma from the process gas and a plasma outlet are provided. The plasma generation device has at least two plasma modules for generating a plasma. Each plasma module has at least one gas outlet for some of the process gas, wherein the at least one gas outlet of at least one plasma module issues into a respective gas inlet of another plasma module.

18 Claims, 8 Drawing Sheets

(51) Int. Cl.
*H05H 1/36* (2006.01)
*H05H 1/44* (2006.01)

(58) Field of Classification Search
USPC  315/111.41; 216/67; 438/689, 706; 118/697, 118/723 E, 723 R, 723 I; 345/48
See application file for complete search history.

(56) References Cited

U.S. PATENT DOCUMENTS

| | | | | |
|---|---|---|---|---|
| 5,820,723 | A * | 10/1998 | Benjamin | H01J 37/16 118/723 E |
| 2002/0127853 | A1* | 9/2002 | Hubacek | H01J 37/32009 438/689 |
| 2002/0153024 | A1* | 10/2002 | Akiba | B08B 7/00 134/1.1 |
| 2005/0022736 | A1* | 2/2005 | Steger | H01J 37/321 118/715 |
| 2005/0269199 | A1* | 12/2005 | Pollak | A61L 2/14 204/164 |
| 2007/0193517 | A1* | 8/2007 | Matsuuchi | H01J 37/32192 118/723 MW |
| 2008/0038927 | A1* | 2/2008 | Yamaguchi | H01L 21/02057 438/706 |
| 2008/0209807 | A1* | 9/2008 | Tsangaris | C10J 3/20 48/89 |
| 2009/0020456 | A1* | 1/2009 | Tsangaris | C10G 2/30 208/133 |
| 2010/0170872 | A1* | 7/2010 | Hirayama | H01J 37/32192 216/67 |
| 2010/0296977 | A1* | 11/2010 | Hancock | A61L 2/14 422/186 |
| 2010/0301702 | A1* | 12/2010 | Tao | H01L 41/044 310/318 |
| 2011/0121736 | A1* | 5/2011 | Hirayama | H01J 37/32192 315/111.41 |
| 2012/0247390 | A1* | 10/2012 | Sawada | C23C 16/4412 118/723 AN |

FOREIGN PATENT DOCUMENTS

| | | |
|---|---|---|
| DE | 102005032890 A1 | 1/2007 |
| DE | 102007010996 A1 | 9/2008 |
| DE | 102007024090 A1 | 11/2008 |
| DE | 102008018827 A1 | 10/2009 |
| EP | 1441578 A2 | 7/2004 |
| GB | 1412300 A | 11/1975 |
| WO | 2009060213 A1 | 5/2009 |
| WO | 2009062846 A1 | 5/2009 |
| WO | 2009092846 A1 | 7/2009 |

OTHER PUBLICATIONS

Title: DE102007010996, Author:Willimzik Martin, Date:Sep. 11, 2008 (Translation).*

* cited by examiner

PLASMA GENERATING DEVICE

CROSS REFERENCE TO RELATED APPLICATIONS

This application is filed under 35 U.S.C. §120 and §365(c) as a continuation of International Patent Application PCT/EP2013/059150, filed on May 2, 2013, which application claims priority from German Patent Application No. 10 2012 103 938.0, filed on May 4, 2012, which applications are incorporated herein by reference in their entireties.

FIELD OF THE INVENTION

The invention relates to a plasma generating device for generating a plasma with at least two plasma modules. Each of these plasma modules includes at least a gas inlet for a process gas, a discharge device for the generation of plasma from the process gas and a plasma outlet.

BACKGROUND OF THE INVENTION

Plasma treatments are widely used, for example to activate surfaces for a better adhesion, for the sterilization of food, wounds or surgical cutlery, for coating or even to the in situ production of ozone from precursor gases. Especially the industrial field of application of plasma treatment extends to new special applications. Increasingly, non-plasma-based standard processes are replaced by plasma processes. The requirements on the plasma may vary from application to application regarding the plasma properties (such as plasma pressure, plasma power, plasma density, plasma temperature or degree of ionization) or the design of the plasma generator. Cost efficiency and at the same time variable applicable concepts are drivers for standardized plasma generators. Desirable properties are in particular a compact, flexible design of the plasma generator, low voltage operation to atmospheric pressure and a lower excess heat during the plasma generation. Plasma sources with a nozzle shaped structure can produce plasma beams with a relatively high ion density. However, as a wide surface machining of components is only possible by scanning the plasma beam across the surface. At a given power density of plasma generator the processing time increases with the area to be treated. In case an increased number of plasma generators is simultaneously used the overhead for the electrical wiring and supplies with process gas increases as well.

The German patent application DE 37 33 492 A1 discloses a device with an electrically powered plasma generator. Two electrodes form an air gap, through which a gas stream is conducted. With the help of a corona discharge the streaming gas is ionized.

The UK patent application GB 1 412 300 A reveals an arc generator with a plurality of electrodes to which an at least three-phase AC voltage is applied in order to ignite plasma beam from a gas and to direct the plasma beam onto a work piece which is at ground potential. In accordance with one embodiment, the three electrodes reach into a gas flowed trough housing with a nozzle and are connected individually via a control line to a current regulator. In accordance with another embodiment, groups of three electrodes are connected with a current regulator, which are in turn connected to a voltage source.

The German patent application DE 10 2007 024 090 A1 suggests a device for plasma treatment that includes several plasma generators. In housing of each plasma generator, acting as an external electrode, a nozzle opening is trained which houses an inner electrode. About a branch of a common gas supply of the device, a gas stream is fed into each plasma source.

Piezoelectric high-voltage generators are used in plasma sources as electrodes and are suitable for light the plasma from gases near atmospheric pressure, see for example, DE 10 2005 032 890 A1. However, they are limited in their performance by the thermal losses and its electromechanical limit. The power limit by the thermal losses can be overcome by an efficient transfer of heat to the environment, but their overall performance limited remains. This is accompanied by a reduced plasma power when compared to other types of plasma generators. A cluster of several such plasma generators is also possible, with which a sufficiently high plasma density over larger areas can be achieved.

With a nozzle like structure, the plasma density can be increased locally by a secondary plasma beam, which is produced with relatively high ion density. However, a large-scale treatment of a surface is possible a grid like scanning of the surface with the plasma beam. Apart from the mechanically complex additional scanning device the time to treat surfaces is thus significantly extended. The clusters described DE 10 2005 032 890 A1 allow a little variable and limited configurability of the system. Also, the electrical wiring and supply of process gas of the individual plasma generators and is time-consuming and expensive.

SUMMARY OF THE INVENTION

It is an object of the invention to provide a plasma generating device, which is easy to assemble, to upgrade, to maintain and to operate. This problem is solved by a plasma generating device which includes at least two plasma modules, a module housing provided to each plasma module, wherein the plasma module has at least one gas inlet for supplying a process gas, a discharge means provided in the module housing for generating the plasma from the process gas, a plasma outlet, and at least one gas outlet for a portion of the process gas is provided with each plasma module, wherein the at least one gas outlet of at least one plasma module opens in each case into the gas inlet of another plasma module; and the plasma modules are pluggable connected with each other in a form-fit and/or force-fit manner.

The inventive plasma generating device for generating a plasma comprises at least two plasma modules. This can be operated independently or in conjunction with other identical or similar plasma modules. In a module housing of each plasma module at least one gas inlet for supplying a process gas and at least a gas outlet for a portion of the process gas, which is not in the plasma state, is provided. The gas inlets and gas outlets are in fluid communication via a gas supply channel, trained in the module housing. A discharge means is provided in the module housing for generating the plasma from the process gas.

Preferably the discharge means of the plasma module has a controllable, via a control line, electric driver module and a piezoelectric transformer. The driver module is connected to the primary side of the piezoelectric transformer via at least two electrical cables. A piezoelectric transformer can be designed in compact design and can generate with a relatively low primary side input voltages (e.g. 24 V AC) a sufficiently high voltage at his secondary side in order to ignite a plasma from the gas in the normal pressure range (ambient pressure). The plasma outlet of the plasma module can be trained as a nozzle to create a targeted plasma beam.

In particular, the secondary side of the piezoelectric transformer can be arranged in the nozzle.

According to an embodiment of the invention a control module of the plasma module is assigned to the module housing. The control module can be an integral part of the module housing. It is also conceivable that the control module is a releasable connected component of the module housing. The control module is electrically connected via a control line and at least one voltage line with the discharge means. The control module supports at least an output interface and at least an input interface for the at least one voltage supply line and the control line.

The control module has a control line and at least one voltage supply line, which are electrically connected to the driver module. Furthermore, the control module has at least one output interface and one at least one input interface.

The invention plasma generating device for generating a plasma consists of at least two plasma modules. Each plasma module has a module housing with at least one gas inlet to the supply of a process gas and a plasma outlet. A discharge means for the generation of plasma from the process gas is provided in the module housing. In addition, at least a gas outlet for a portion of the process gas is formed with each plasma module. The plasma generation means is designed in such a way that the at least a gas outlet of the at least one plasma module enters into a gas inlet of another plasma module. This creates a superordinate gas supply channel via which all plasma modules of the plasma generating device are in fluid communication. For example, the entire plasma generation device is supplied with a single external gas supply pipe with process gas.

The discharge means of the plasma generating device can have in particular a controllable electric driver module, which is electrically connected to a piezoelectric transformer for the production of plasma by means of discharge in the normal pressure range.

In a particular embodiment of the invention of the plasma generating device, each plasma module can include a control module. Each control module is electrically connected via a control line and at least one voltage supply line with the discharge means of the respective plasma module. For each of its voltage supply lines and for its control line, the control module carries at least an input interface and at least one output interface. The plasma modules are connected with each other, such that at least one output interface of the control module of each first plasma module is electrically connected with at least an input interface of the control module of a connected plasma module. The control lines are connected such that as common control bus is formed to the control all and each of the coupled plasma modules, respectively.

The plasma modules of the plasma generating device are preferably connected electrically via their control modules with each other. Consequently, at least a gas inlet of a plasma module is in fluid communication with a gas outlet of a connected plasma module.

The plasma modules can be connected directly or indirectly through an arrangement of spacing bridges. A spacing bridge according to the invention has a connector and a gas supply channel with at least a gas inlet and a gas outlet. A single spacing bridge connects at least two successive plasma modules, so that the connector of the spacing bridge electrically connects the plasma control modules, and that at least a gas outlet of one plasma module is in fluid communication with a gas inlet of a further module.

The coupling of plasma modules with each other can be in particular designed releasable and based on force or form closure. So the plasma modules or the plasma module and the spacing bridge can be pluggable connected with each other, so that a force or form closure is created. According to a preferred embodiment of the invention, the connection is based on a connection assembly. The connection can additionally be secured by engagement hooks, screws, bolts or ears with cable straps. For example, the gas inlets and gas outlets can be designed as positive interlocking counterpart of a couple of plugs, resulting in a gas-tight coupling. Sealant such as seals or sealing grease can be provided for additional sealing of the plug connector. Similarly, the input interface and output interface of the control modules can be trained as positive interlocking counterparts of a couple of plugs.

The plasma generating device can be designed such, that at least one plasma inlet and/or a plasma outlet of a plasma module is not connected with a gas outlet and a gas inlet of another plasma module or a spacing bridge, respectively.

In accordance with one embodiment of the invention, this free gas inlets and gas outlets can remain open, so that the plasma generation device can, if required be cooled with gas. In accordance with another embodiment of the invention, the free gas inlets and gas outlets are sealed gas-tight with closure elements. Closure elements are, for example, blind flanges with sealing elements. The free gas inlets and gas outlets can also by a housing of a plasma generation device, which encloses the plasma modules. In particular, all free gas inlets or gas outlets can be sealed with closure elements so that gas can exit only through the plasma outlets of the housing module of the plasma modules.

The plasma modules can be connected directly or via spacing bridges with each other. According to the Invention to each spacing bridge is a connector, so that the control modules of the plasma modules are electrically connected. In addition or alternatively any spacing bridge can have at least a gas inlet and a gas outlet. According the invention to at least one gas inlet and at least one gas outlet of each spacing bridge leads to a gas outlet or a gas inlet of connected plasma modules or further connected spacing bridges.

The connected plasma modules of the plasma generating device can be arranged in a one, two- or three-dimensional way. For example, the plasma modules and/or spacing bridges of the plasma generating device are connected in a one-dimensional arrangement, such as a linear row or a closed contour like a circle. A further possibility is a two-dimensional matrix arrangement. For example, if a work piece with a depth profile, like with a groove, needs to be plasma treated, the plasma modules are connected at a side and from below with a spacing bridge. The advantage of the invention is, that any one-, two- or three-dimensional contour can be depicted by a matrix of plasma modules, so that the plasma generating device needs only to be positioned above a work-piece to be plasma treated. This is often faster, easier and more cost effective than a scan a contour or surface of the work-piece by a robot or a user. The processing time increases with fixed power density of the area to be treated with the plasma generator. Portions of areas of a contour or a surface can be left open by the plasma treatment by using appropriately positioned spacing bridges or by a selective activation of the plasma modules.

According to a particular embodiment of the invention, the plasma modules and spacing the bridges of the plasma generating device can be attached on a common mounting batten. Advantageous, the attachment is releasable, e.g. a plug-in. The mounting batten can be designed, for example, as a terminal strip, pneumatic strip or top hat rail.

According to a particular embodiment of the invention plasma generating device all plasma modules are surrounded by a common housing. In particular the plasma outlet of the plasma modules from the common housing can lead out via a common plasma outlet. The plasma outlet can as well enter into a connected plasma module.

The proposed plasma generating device has the advantage that it can be modularly extended and converted easily. The supply voltage is in the range of low voltage (e.g. 24V bus). Still, the cooling of the components can be achieved by the process gas because the plasma modules have a large total surface area across which the process gas flows. Furthermore, a simple installation, maintenance, and a simple exchange of individual components are possible. In addition, individual control of plasma modules is achieved via a control bus.

Thus the power of plasma generating device can be expanded in a modular way, while at the same time an uneconomic diversity in the parts of the basic construction elements is largely avoided.

Peripheral devices, like voltage sources, gas supplies (e.g. blowers or gas tanks with pressure regulators, mass flow, controllers for controlling the plasma sources via control cables, carrying scaffolds or work-piece holders, are assigned to the plasma generating device. The peripheral devices are connectable via appropriate cables with the plasma generating device. These cables are provided advantageously inventive control modules, input interfaces, output interfaces and gas inlets and gas outlets respectively. An inventive plasma generating device can in turn be a module in a system of plasma generating devices.

Controlled and homogeneous plasma conditions must prevail in all plasma modules of plasma generating device, therefore the dynamic and static pressure conditions in the plasma modules must be homogeneous, where the plasma is ignited from the process gas. This requires a homogeneous pressure or back pressure in the superior channel of gas supply. The back pressure is sufficiently homogeneous, if the total of the free cross sectional areas of plasma outlets of all plasma modules is small against the free cross sectional area of the superior channel of the gas supply. This condition limits the number of e.g. in series connectable plasma modules. The "free" cross sectional area, referred here, stand for the area, through which gas can flow and from which flow impedance are ruled out. A flow impedance represents, for example, an electrode arranged in the plasma outlet opening. To achieve homogeneous plasma conditions in the plasma modules, it is also beneficial to supply the plasma modules with a minimal gas flow velocity (e.g. with Reynolds number under 1000) and laminar flow. Furthermore, flow impedance or elements causing turbulences should be avoided by the design of the module housing or the housing of plasma generating device.

The control line can act as a data line to log the plasma treatment process through an electronic data set and to secure the electronic data for example in a connected non-volatile storage medium. This increases the comprehensibility, e.g. which work piece was subjected when and to what plasma treatment, and thus contributes to the security of the process.

A further advantageous embodiment of the plasma generating device for generating a plasma, includes at least two plasma modules, a module housing provided to each plasma module, wherein the plasma module has at least one gas inlet for supplying a process gas, a discharge means provided in the module housing for generating the plasma from the process gas, a plasma outlet, at least one gas outlet for a portion of the process gas is provided with each plasma module, wherein the at least one gas outlet of at least one plasma module opens in each case into the gas inlet of another plasma module; and the plasma modules are pluggable connected with each other in a form-fit and/or force-fit manner, and a control module is associated with the plasma modules of the plasma generating device, wherein the control module has a control line and at least one voltage supply line, which are electrically connected to a electric driver module of the discharge means.

Still another advantageous embodiment of the plasma generating device for generating a plasma, comprises, at least two plasma modules, a common housing houses the plasma modules, wherein each plasma module has at least one gas inlet for supplying a process gas, a discharge means for generating the plasma from the process gas, a plasma outlet and at least one gas outlet for a portion of the process gas, wherein the at least one gas outlet of the at least one plasma module opens in each case into the gas inlet of another plasma module, a common gas supply is formed by the common housing via which the process gas is directed into the common housing, and separating walls are provided inside the common housing to separate the plasma modules, wherein the separating walls define an upper section and a lower section, the gas outlet and the gas inlet are provided at the upper section of the separating walls and plasma outlets are provided the lower sections of the separating walls.

BRIEF DESCRIPTION OF THE DRAWINGS

Further advantages and advantageous embodiments of the invention are subject of the following figures and the corresponding parts of the description. Same and equal-functioning features are marked with the same reference numeral.

It shows in detail.

DETAILED DESCRIPTION OF THE INVENTION

Figure 1:
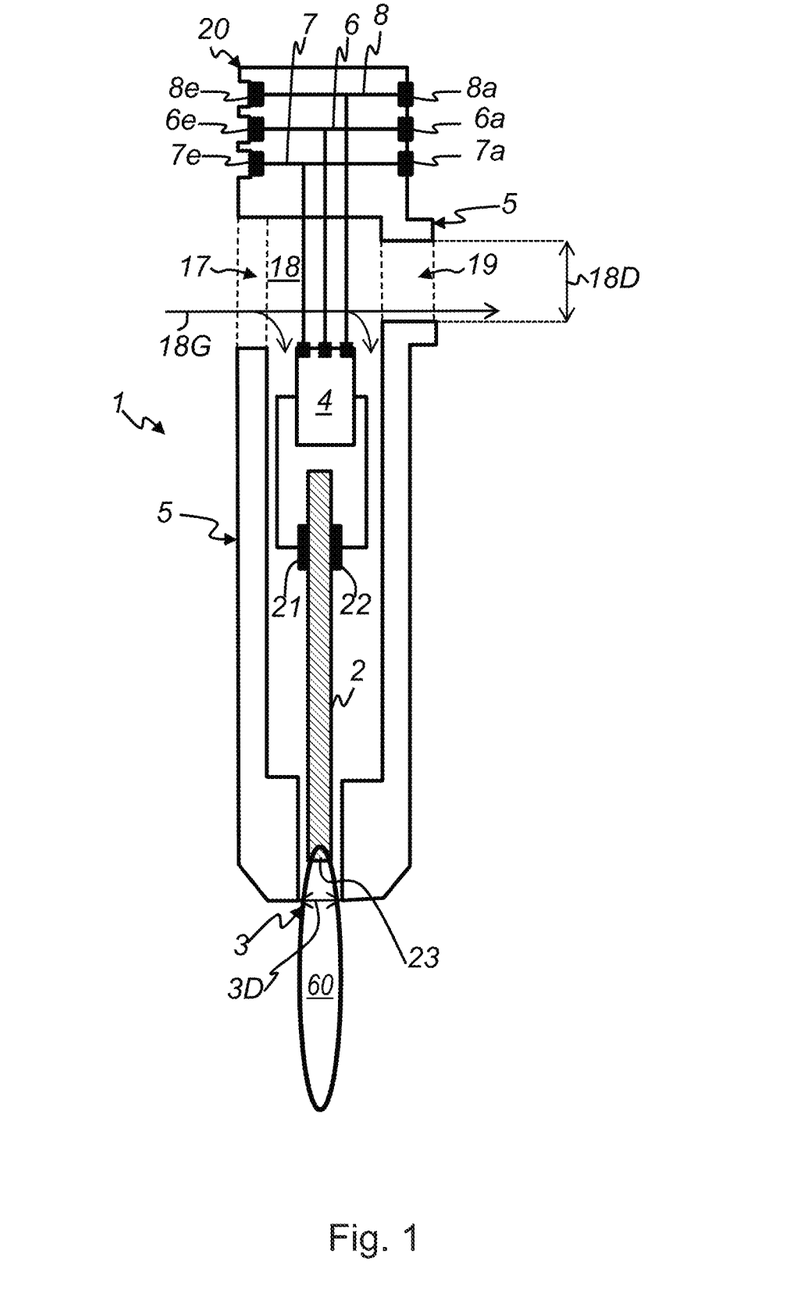
FIG. 1 is a schematic representation of an inventive plasma module.

An inventive plasma module 1, which is a component of a plasma generating device 100 is schematically shown in FIG. 1. Plasma module 1 has module housing 5, in which piezoelectric transformer 2 and electronic driver module 4 are housed. Piezoelectric transformer 2 is basically a piezoelectric crystal rod with two primary-side power-electrodes 21, 22 and secondary side electrode 23. By applying an AC voltage on the primary side electrodes 21, 22 mechanical vibrations are induced in the piezoelectric crystal rod. The frequency of the mechanical vibrations is dependent from the geometry of the piezoelectric crystal rod, which acts as a resonator, and the mechanical construction of piezoelectric transformer 2. The mechanical vibrations produce, due to the piezoelectric effect, an output voltage on secondary side 23 of the piezoelectric crystal rod. Depending on the geometry of the piezoelectric crystal rod and the position of electrodes 21, 22, the output voltage is higher or lower than the input voltage. As a result of the high transformation ratio, low input voltages can be transformed power-efficient into high output voltages. The performance range of a single piezoelectric transformer 2 is relatively low and is up to some 10 Watts, at resonance frequencies around some 10 kHz up to several 100 kHz. Thus high sinusoidal AC voltages can be generated easily, which are suitable for the generation of plasma 60.

Through gas inlet 17, process gas 18G can flow in module housing 5. A portion of process gas 18G flows out again over gas supply channel 18 from gas outlet 19 from module housing 5. Another portion flows out through plasma outlet 3 as directed beam of plasma 60. On secondary side 23 of piezoelectric transformer 2, process gas 18G is transferred into plasma 60 prior to the flow out. Plasma outlet 3 can be structured as a nozzle or a nozzle with a variable geometry can be attached to plasma outlet 3.

Module housing 5 is equipped with control module 20. Two voltage supply lines 6, 7 and control line 8 of control module 20 are electrically connected with electric driver module 4. Electric driver module 4 is electrically connected to the two primary-side electrodes 21, 22 of piezoelectric transformer 2. The electrical power, effective on piezoelectric transformer 2, is controlled according to the control signals transmitted via control line 8. On the side of gas inlet 17, control module 20 has individual input interfaces 6e, 7e and 8e for voltage supply lines 6, 7 and control line 8. On the side of gas outlet 19, individual and corresponding output interfaces 6a, 7a and 8a are formed. The input interface 6e, 7e, 8e and output interfaces 6a, 7a, 8a are formed on the module housing, such that input interfaces 6e, 7e, 8e of plasma module 1 is connectable with output interfaces 6a, 7a, 8a of a further plasma module 1. Likewise, gas outlets 19 and gas inlets 17 are formed such on module housing 5 of plasma module 1 that gas inlet 17 of one plasma module 1 is connectable with gas outlet 19 of a further plasma module 1.

Plasma module 1 should be constructed in such a way, that cross section 18D of gas supply channel 18 is greater than cross section 3D of plasma outlet 3. Plasma generating devices 100 (see FIG. 2 or FIG. 4), which are made from several plasma modules 1, should have a gas supply channel 18 wherein its cross section 18D exceeds the sum of cross sections 3D of all plasma modules. This condition ensures that the back pressure of process gas 18G in each plasma module 1 is essentially equal, so that in each plasma module 1, uniform and controlled plasma conditions are present.

Figure 2:
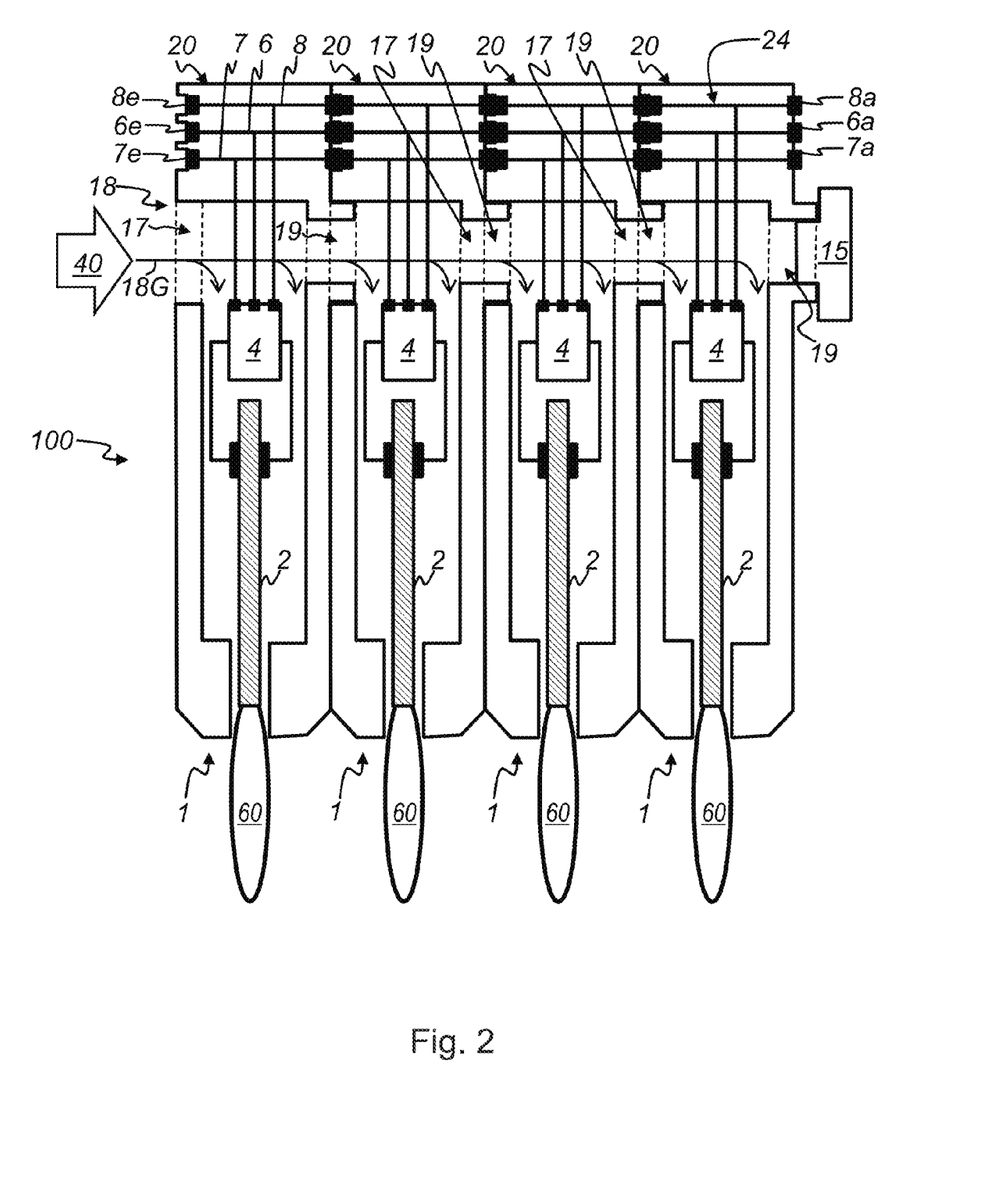
FIG. 2 is a schematic representation of a plasma generating device, formed by serially coupled inventive plasma modules according to FIG. 1.

FIG. 2 illustrates schematically a plasma generating device 100 according to a first embodiment, which is formed by several plasma modules 1 which are coupled together and assembled in a horizontal row. Control modules 20 and gas channels 18 of all neighboring and in the series connected plasma modules 1 are directly connected by the plug connector. Therefore, voltage supply lines 6, 7 of each plasma module 1 are connected to superior power supply lines 6, 7, control lines 8 of each plasma module 1 are connected to superior control line 8 and gas channels 18 of the individual plasma modules 1 are connected to superior gas channel 18. Connected control lines 8 of the control modules form control bus 24, so that each plasma module 1 can be controlled individually.

One preferred embodiment of the invention provides that gas inlet 17 and gas outlet 19 are interlocking counterparts of the plug connector. To increase the gas tightness of this plug connector, suitable sealing elements (not shown) can be provided between gas inlet 17 and gas outlet 19.

Figure 3A:
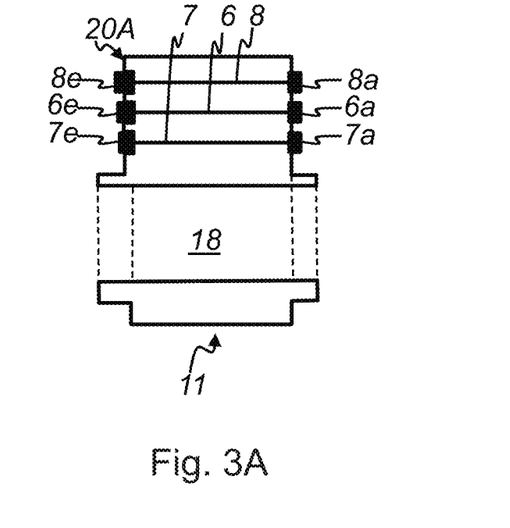
FIG. 3A is a schematic representation of an embodiment of the inventive spacing bridge.
Figure 3B:
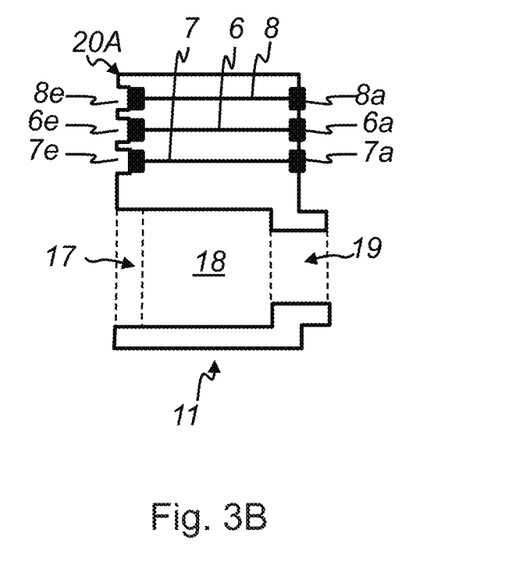
FIG. 3B is a schematic representation of a further embodiment of the invention spacing bridge.

FIGS. 3A and 3B show two embodiments of inventive spacing bridges 11. Spacing bridge 11, shown in FIG. 3A, carries, according to the invention, connector 20A, voltage supply lines 6, 7 and control line 8. Voltage supply lines 6, 7 and control line 8 carry input interfaces 6e, 7e and 8e and output interface 6a, 7a, 8a arranged on connector 20A. Additionally, spacing bridge 11 has gas inlet 17 and gas outlet 19, which are in fluid communication via gas supply channel 18.

According to the embodiment shown in FIG. 3A, all gas inlets 17 and gas outlets 19 as well as all input interfaces 6e, 7e, 8e and output interfaces 6a, 7a, 8a of spacing bridge 11 of plasma modules 1 are formed "male" and "female" respectively. Thus, spacing bridge 11, according to this embodiment, can be coupled with one or more plasma modules 1. Spacing bridges 11 of this embodiment can be connected with each other and/or with plasma modules 1.

Figure 5:
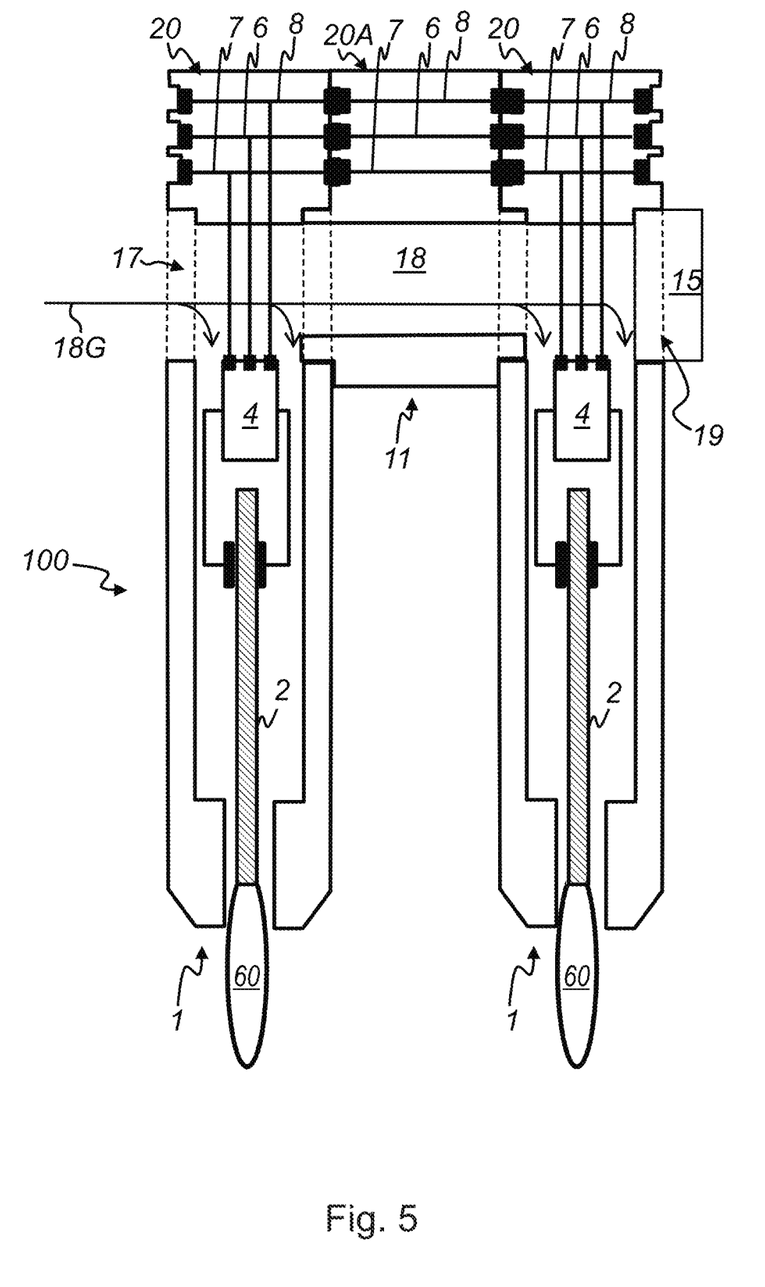
FIG. 5 is a schematic representation of a plasma generating device with spacing bridge of FIG. 3B and plasma modules according to FIG. 1.

In accordance with the further embodiment, shown in FIG. 3B, of spacing bridges 11 all gas inlets 17 and gas outlets 19 on and all input interfaces 6e, 7e, 8e and output interfaces 6a, 7a, 8a of spacing bridges 11 are "male" and that plasma module 1 are "female" (see FIG. 5).

Figure 4:
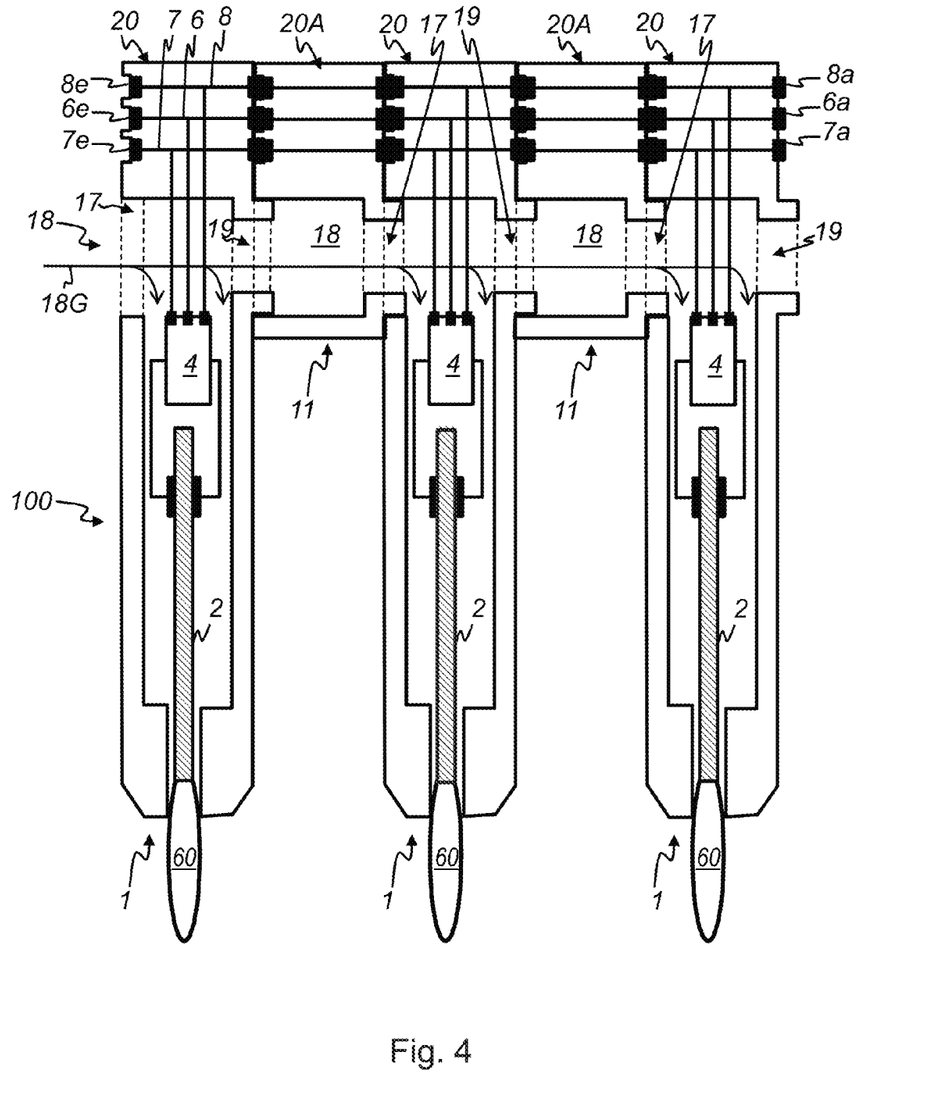
FIG. 4 is a schematic representation of a plasma generating device with a spacing bridge of FIG. 3A and plasma modules according to FIG. 1.

FIG. 4 shows a schematic representation of a further embodiment of inventive plasma generating device 100. Plasma generating device 100 is formed of spacing bridges 11 according to FIG. 3A and plasma modules 1 according to FIG. 1. While according to the example shown in FIG. 2, plasma generating device 100 is defined by a direct coupling of several plasma modules 1, plasma modules 1, as shown in FIG. 4, are indirectly connected through spacing bridges 11. Within inventive plasma generating device 100, plasma modules 1 are basically coupled directly or indirectly by spacing bridges 11. To bridge larger distances between plasma modules 1, two or more spacing bridges 11 are coupled in between.

FIG. 5 illustrates a further embodiment inventive plasma generating device 100. It includes spacing bridges 11 according to FIG. 3B and plasma modules 1, whose gas inlets 17, gas outlets 19, input interfaces 6e, 7e, 8e and output interfaces 6a, 7a, 8a are formed as a "female" part of the connector. This allows indeed that plasma modules 1 and spacing bridges 11 are assembled to plasma generating devices 100 of variable geometry. However, plasma modules 1 or the spacing bridges 11 of this embodiment cannot be connected with each other. According to the invention, plasma generating devices 100 can be formed as well from combinations of spacing bridges 11 and/or plasma modules 1 of the embodiments according to FIGS. 4 and 5.

Figure 6:
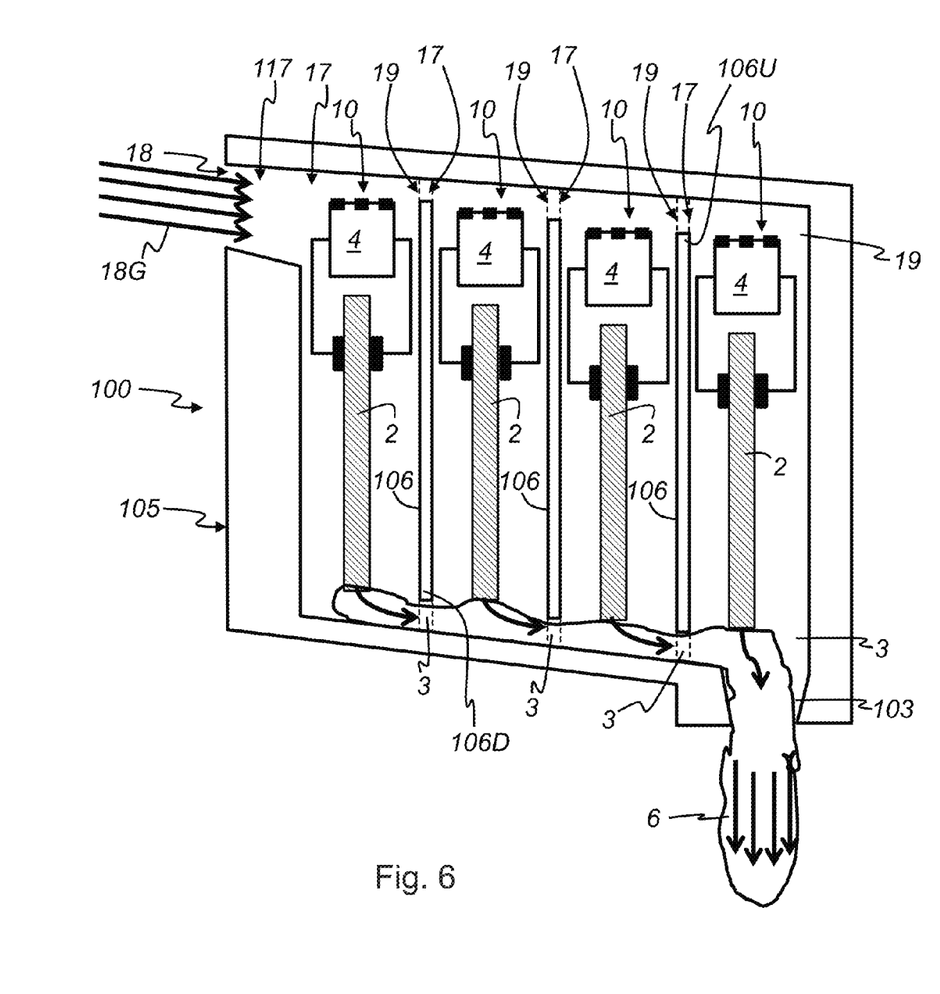
FIG. 6 is a schematic representation of a plasma generating device with the inventive design of a common housing.

In FIG. 6 is another embodiment of plasma generating device 100 is shown schematically. In this embodiment, plasma modules 1 are housed in common housing 105. Housing 105 has common gas supply 117 via which process gas 18G is directed into the housing 105, so that it enters into gas inlet 17 of first plasma module 1. Module housing 5 of plasma module 1 is formed in this embodiment of the walls of housing 105 and of separating walls 106 inside housing 105. Between upper section 106U of separating walls 106 and housing 105, apertures are provided, which each are gas outlet 19 and gas inlet 17 of consecutive plasma modules 1, respectively. Also between lower section 106L of separating walls 106 and housing 105 openings are provided, which act as laterally arranged plasma outlets 3 which enter into adjacent plasma module 1. Plasma outlet 3 of at least one plasma module 1 joins at least a common plasma outlet 103 of housing 105. From this common plasma outlet 103, a beam of plasma 60 exits housing 105, which consequently has a higher intensity, ion density or power density as plasma 60 generated with single plasma module 1 only. Plasma modules 1 are connected via their respective control modules (not shown).

Figure 7A:
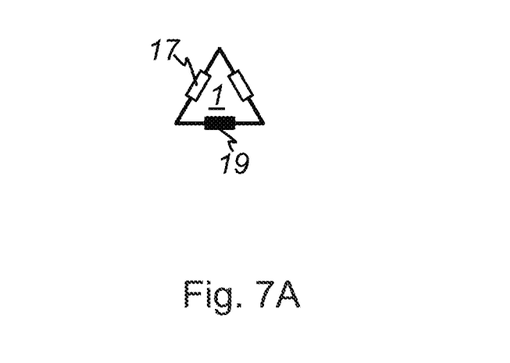
FIG. 7A is a schematic representation of an inventive plasma module with triangular cross-section profile.
Figure 7B:
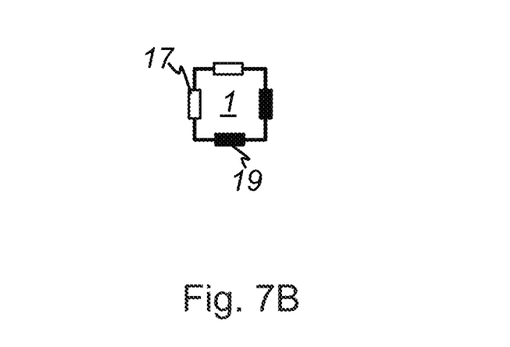
FIG. 7B is a schematic representation of an inventive plasma module with square cross-section profile.
Figure 7C:
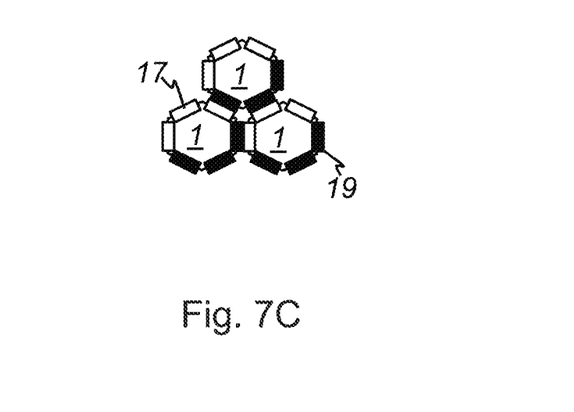
FIG. 7C is a schematic representation of an inventive plasma module with hexagonal cross-section profile.

FIGS. 7A, 7B and 7C show schematically possible polygonal cross section profiles of inventive plasma modules 1. Inventive spacing bridges 11 can be formed appropriately. In the sense of a flexible modularity, the cross section is designed preferably as an equilateral polygon. Each side area of plasma module 1 can carry a gas inlet 17 or a gas outlet 19. It is also possible that some side areas of plasma modules 1 do not have a gas inlet 17 or gas outlet 19. As each side of plasma module 1 can have input interface 6e, 7e, 8e or output interface 6a, 7a, 8a of control module 20 and connector 20A respectively (not shown here). The smaller the cross sectional area of plasma module 1 is, the more compact they can be arranged to plasma generating device 100, and higher areal plasma power densities can be achieved with plasma modules 1 of a given power limit. Plasma modules 1 and spacing bridges 11 of different cross sectional profiles can be combined in inventive plasma generating device 100.

FIG. 7A shows a triangular cross section profile, where plasma module 1 carries two plasma inlets 17 and one plasma outlet 19. FIG. 7B shows a square cross section profile, which carries on each adjacent side faces two plasma inlets 17 and two plasma outlets 19. FIG. 7C shows three plasma modules 1 coupled with each other with a hexagonal cross section profile, which carries three plasma inlets 17 and three plasma outlets 19 on each of three adjacent side faces.

FIG. 8A to 8D illustrate schematically on some simple examples, how invention plasma modules 1 can be coupled to inventive plasma generating devices 100. For the sake of clarity, only plasma modules 1 are shown. In principle at least one inventive spacing bridge 11 can be used between each plasma module 1. The embodiments shown in the FIGS. 8A to 8D can be combined according to the invention in order to form more complex plasma generating devices 100 and/or fit to create special-application plasma generating devices 100.

Figure 8A:
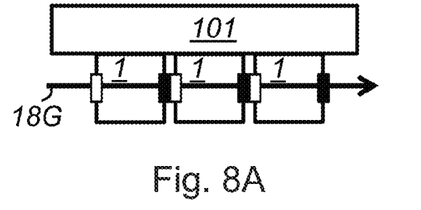
FIG. 8A is a schematic representation of an inventive embodiment plasma generation device with mounting batten.

FIG. 8A shows a schematic top view of an embodiment of inventive plasma generating device 100 with mounting batten 101, to which three plasma modules 1 are coupled serially to each other. Plasma modules 1 and also spacing bridges 11 can be pushed or clicked easily on mounting batten 101. It is also possible that a defective plasma module 1 can be exchanged quickly and easily. In this way, the down time of a system which uses plasma modules 1 is restricted to a minimum. Similarly, plasma generating device 100 can be adapted to the various configurations of the work piece to be treated with the plasma.

Figure 8B:
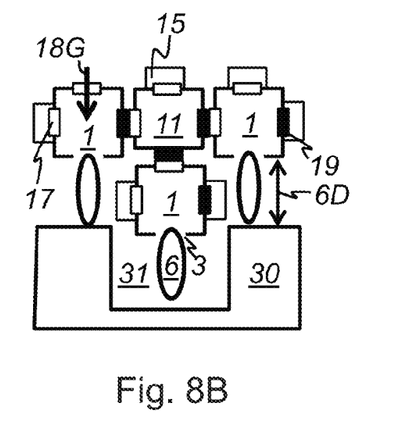
FIG. 8B is a schematic side view of a further embodiment of the inventive plasma generating device which is a three-dimensional matrix of plasma modules.

FIG. 8B is a schematic side view of an embodiment of inventive plasma generating device 100 in a three-dimensional set-up. Two plasma modules 1 are coupled with each other by spacing bridge 11. A third plasma module 1 is coupled to a lower side of spacing bridge 11, so that third plasma module 1 is, compared to the two other plasma modules 1, deposed to bottom. With this example, work piece 30 with cut-out 31 can be treated in one process step and anywhere with the same working distance 6D (typically about 1-5 cm) to plasma outlet 3. The dimensions of plasma modules 1 can be different from the dimensions of spacing bridge 11. Spacing bridge 11 can have, according to the invention, a triangular side profile, so that plasma module 1, connected to spacing bridge 11 from below, is directed at a different angle to work piece 30 as two spacing bridges 11 connected to the sides of plasma modules 1, in order to provide a more homogeneous plasma treatment of the vertical surfaces of recess 31.

Figure 8C:
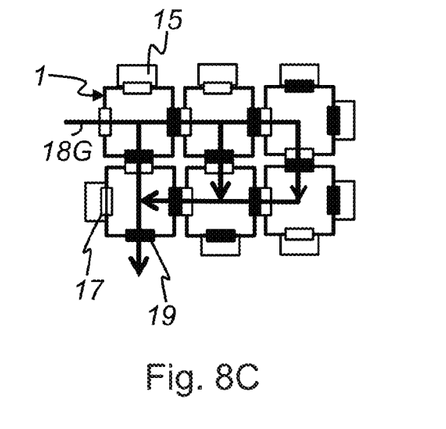
FIG. 8C is a schematic top view of a further embodiment of the inventive plasma generating device as a two dimensional matrix of plasma modules.

FIG. 8C shows a schematic top view of a further embodiment of inventive plasma generating device 100, which has two rows with three identical plasma modules 1. In order to connect the top row and bottom row in the inventive manner, the third plasma module 1 from left is rotated 90° counter clockwise. Generally, inventive plasma module 1 with polygonal cross section can be coupled at an angle orientation with other plasma modules 1 or spacing bridges 11, which represents a multiple of 360° divided by the number of corners of its cross section. In this exemplary embodiment, all unconnected gas inlets 17 and gas outlets 19 are sealed with closure elements 15 and all adjacent plasma modules 1 are in direct fluid communication with each other.

Figure 8D:
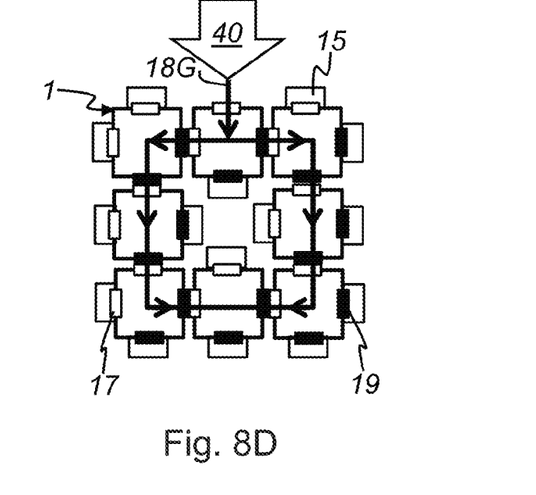
FIG. 8D is a schematic top view of a further embodiment of the inventive plasma generating device, wherein the plasma modules are arranged in form of a closed contour.

FIG. 8D shows a schematic top view of a further embodiment of inventive plasma generating device 100. The identical and identical angle oriented plasma modules 1 are each connected to two other plasma modules 1 along a closed contour. Gas inlet 17 is connected to external gas supply 40. All unconnected gas inlets 17 and gas outlets 19 are sealed with sealing elements 15, so that process gas 18G can flow only as plasma 60 from plasma outlets 3 of plasma module 1.

The invention has been described with reference to exemplary and preferred embodiments. It is obvious to a skilled person that in the light of the disclosure of the invention, various forms of execution or aspects of the invention can be combined without leaving the scope of protection the following claims.

LIST OF REFERENCE NUMERALS

1 plasma module
2 piezoelectric transformer
3 plasma outlet
3D cross section
4 electric driver module
5 module housing
6 voltage supply line 6e input interface
6a output interface
6D working distance
7 voltage supply line
7e input interface
7a output interface
8 control line
8e input interface
8a output interface
11 spacing bridge
15 closure element
17 gas inlet
18 gas supply channel
18D cross section
18G process gas
19 gas outlet
20 control module
20A connector
21, 22 primary side electrodes
23 secondary side electrodes
24 control bus
30 work piece
31 cut out
40 external gas supply
60 plasma
100 plasma generation device
101 mounting batten
103 common plasma outlet
105 housing
106 separating wall
106U upper section
106L lower section
117 common gas supply

What is claimed is:

1. A plasma generating device for generating a plasma comprising:
    at least two plasma modules;
    a module housing provided to each plasma module, wherein the plasma module has at least one gas inlet for supplying a process gas;
    a piezoelectric transformer and a controllable electric driver module are provided in the module housing for generating the plasma from the process gas;
    a plasma outlet; and
    at least one gas outlet for a portion of the process gas is provided with each plasma module, wherein the at least one gas outlet of at least one plasma module opens in each case into the gas inlet of another plasma module; and the plasma modules are pluggable connected with each other in a form-fit and/or force-fit manner,
    wherein a spacing bridge has a connector and the at least one gas inlet and the at least one gas outlet, and the spacing bridge connects at least two successive plasma modules to each other such that the connector of the spacing bridge electrically connects the control modules of the plasma modules, and that at least one gas outlet of one plasma module is in fluid communication with the gas inlet of the spacing bridge and the gas outlet of the spacing bridge is in fluid communication with a gas inlet of a further plasma module, and
    wherein the plasma module and the spacing bridge are pluggably connected to each other so that a form-fitting and/or force-fitting connection is produced.

2. The plasma generating device according to claim 1, wherein each plasma module of the plasma generating device has a module housing, at least one gas inlet for supplying a process gas, a piezoelectric transformer and a controllable electric driver module in the module housing for generating the plasma from the process gas, a plasma outlet, and at least one gas outlet for a portion of the process gas.

3. The plasma generating device according to claim 1, wherein the plasma is generated by the piezoelectric transformer is carried out by discharge at ambient pressure ranges.

4. The plasma generating device according to claim 1, wherein each plasma module comprises:
    a control module, each of which has a control line and at least one voltage supply line electrically connected to each electric driver module, wherein the control module carries at least one input interface and at least one output interface and at least two plasma modules are interconnected such that at least one output interface of the control module of each first plasma module forms at least an input interface of the control module of an electrically connected second plasma module, so that the connected control lines of the control modules of the coupled plasma modules from a common control bus.

5. The plasma generating device according to claim 4, wherein the plasma modules of the plasma generating device are electrically interconnected via their control modules and at least one gas inlet of a plasma module is in fluid communication with a gas outlet of an associated plasma module.

6. The plasma generating device according to claim 1, wherein the plasma modules are releasably mounted on a common mounting batten.

7. The plasma generating device according to claim 1, wherein the plasma modules and the spacing bridges are releasably mounted on a common mounting batten.

8. The plasma generating device according to claim 1, wherein at least one gas outlet or at least one gas inlet of a plasma module that does not have a gas inlet, a gas outlet to a further plasma module, and a spacing a bridge respectively, is closed with a closure element.

9. The plasma generating device according to claim 1, wherein a plurality of connected plasma modules are arranged in a one-, two-, or three-dimensional arrangement.

10. The plasma generating device according to claim 1, wherein all plasma modules of the plasma generating device are surrounded by a common housing.

11. The plasma generating device according to claim 10, wherein the plasma outlets of the plasma modules in the common housing open out via a common plasma outlet or the common plasma outlet enters into a connected plasma module.

12. The plasma generating device according to claim 10, wherein the plasma modules in the common housing of the plasma generating device are separated by separating walls, wherein the plasma modules, have at least one gas inlet for supplying a process gas, a piezoelectric transformer for generating the plasma from the process gas, a plasma outlet, and at least one gas outlet for a portion of the process gas.

13. The plasma generating device according to claim 12, wherein the piezoelectric transformer has a controllable electric driver module for generating the plasma discharges in the normal pressure range, which are electrically connected to a piezoelectric transformer.

14. The plasma generating device according to claim 13, wherein a control module is associated with the common housing and has a control line and at least one voltage supply line, which are electrically connected to the electric driver module, and wherein the control module has formed at least an output interface and at least an input interface.

15. A plasma generating device for generating a plasma comprising:
   at least two plasma modules;
   a module housing provided to each plasma module, wherein the plasma module has at least one gas inlet for supplying a process gas;
   a piezoelectric transformer and a controllable electric driver module are provided in the module housing for generating the plasma from the process gas, wherein two voltage supply lines electrically connect an electric driver module with two primary electrodes of the piezoelectric transformer;
   a plasma outlet;
   at least one gas outlet for a portion of the process gas is provided with each plasma module, wherein the at least one gas outlet of at least one plasma module opens in each case into the gas inlet of another plasma module and the plasma modules are pluggably connected with each other in a form-fit and/or force-fit manner; and
   a control module associated with the plasma modules of the plasma generating device, wherein the control module has a control line and at least one voltage supply line, which are electrically connected to a electric driver module of the piezoelectric transformer.

16. The plasma generating device according to claim 15, wherein the control module has formed at least an output interface and at least an input interface.

17. A plasma generating device for generating a plasma comprising:
   at least two plasma modules;
   a common housing which houses the plasma modules, wherein each plasma module has at least one gas inlet for supplying a process gas, a discharge means for generating the plasma from the process gas, a plasma outlet and at least one gas outlet for a portion of the process gas, wherein the at least one gas outlet of the at least one plasma module opens in each case into the gas inlet of another plasma module;
   a common gas supply which is formed by the common housing and by which the process gas is directed into the common housing; and
   separating walls which are provided inside the common housing to separate the plasma modules, wherein the separating walls define an upper section and a lower section, and the gas outlet and the gas inlet are provided at the upper section of the separating walls and plasma outlets are provided at the lower sections of the separating walls.

18. The plasma generating device according to claim 17, wherein the plasma outlets of the plasma modules in the common housing open out via a common plasma outlet or the common plasma outlet enters into a connected plasma module.

* * * * *